United States Patent
Newton et al.

(10) Patent No.: US 6,459,581 B1
(45) Date of Patent: Oct. 1, 2002

(54) ELECTRONIC DEVICE USING EVAPORATIVE MICRO-COOLING AND ASSOCIATED METHODS

(75) Inventors: Charles M. Newton, South East Palm Bay, FL (US); Randy T. Pike, Indian Harbour Beach, FL (US); Richard A. Gassman, Palm Bay, FL (US)

(73) Assignee: Harris Corporation, Melbourne, FL (US)

(*) Notice: Subject to any disclaimer, the term of this patent is extended or adjusted under 35 U.S.C. 154(b) by 5 days.

(21) Appl. No.: 09/741,772

(22) Filed: Dec. 19, 2000

(51) Int. Cl.[7] .................................................. H05K 7/20
(52) U.S. Cl. ........................ 361/700; 165/80.3; 257/715
(58) Field of Search ................................ 174/16.3, 252; 165/908, 80.3, 80.4, 121, 104.33, 126; 257/713–715; 62/259.2; 361/688–690, 692, 700, 694–704, 715–719, 722, 735, 790; 29/890.03; 439/694, 698, 700, 702

(56) References Cited

U.S. PATENT DOCUMENTS

| | | | |
|---|---|---|---|
| 3,774,677 A | * 11/1973 | Antonetti et al. ............ 165/285 |
| 3,843,910 A | * 10/1974 | Ringuet ....................... 361/696 |
| 4,729,424 A | * 3/1988 | Mizuno et al. ............. 165/261 |
| 4,897,762 A | * 1/1990 | Daikoku et al. ............ 361/689 |
| 5,105,336 A | * 4/1992 | Jacoby et al. ............... 361/690 |
| 5,161,089 A | 11/1992 | Chu et al. .................... 361/385 |
| 5,170,319 A | 12/1992 | Chao-Fan Chu et al. ... 361/382 |
| 5,237,484 A | * 8/1993 | Ferchau et al. ............. 361/689 |
| 5,309,319 A | * 5/1994 | Messina ....................... 361/699 |
| 5,376,252 A | 12/1994 | Ekström et al. ............. 204/299 |
| 5,390,077 A | * 2/1995 | Paterson |
| 5,443,890 A | 8/1995 | Öhman ......................... 428/167 |
| 5,465,192 A | 11/1995 | Yoshikawa ................... 361/705 |
| 5,596,228 A | * 1/1997 | Anderton et al. ............ 257/714 |
| 5,670,722 A | 9/1997 | Moser et al. .................. 73/756 |
| 5,709,337 A | 1/1998 | Moser et al. ............. 228/124.6 |
| 5,842,787 A | 12/1998 | Kopf-Sill et al. ............ 366/340 |
| 5,876,187 A | 3/1999 | Afromowitz et al. ........ 417/322 |
| 5,907,473 A | * 5/1999 | Przilas et al. ................ 361/699 |
| 5,932,940 A | 8/1999 | Epstein et al. ................. 310/40 |
| 5,957,579 A | 9/1999 | Kopf-Sill et al. ............ 366/340 |
| 5,965,410 A | 10/1999 | Chow et al. ................ 435/91.2 |
| 5,976,336 A | 11/1999 | Dubrow et al. .............. 204/453 |
| 5,978,216 A | * 11/1999 | Choi ............................ 361/690 |
| 5,987,893 A | 11/1999 | Schulz-Harder et al. ...... 62/3.7 |
| 6,001,231 A | 12/1999 | Kopf-Sill ..................... 204/454 |
| 6,007,690 A | 12/1999 | Nelson et al. ............... 204/601 |
| 6,038,129 A | * 3/2000 | Falaki et al. ................. 361/699 |
| 6,096,656 A | * 8/2000 | Matzke et al. ............... 438/702 |
| 6,205,799 B1 | * 3/2001 | Patel et al. ..................... 62/132 |

* cited by examiner

*Primary Examiner*—Gerald Tolin
(74) *Attorney, Agent, or Firm*—Allen, Dyer, Doppelt, Milbrath & Gilchrist, P.A.

(57) ABSTRACT

An electronic device includes a package surrounding at least one integrated circuit, a micro-fluidic cooler in the package, and a controller for controlling the micro-fluidic cooler so that the cooling fluid provides evaporative cooling, such as droplet impingement cooling. The electronic device may comprise a power consumption sensor connected to the at least one integrated circuit, and the controller may control the micro-fluidic cooler responsive to the power consumption sensor. A temperature sensor may be connected to the at least one integrated circuit, and the controller may control the micro-fluidic cooler responsive to the sensed temperature. The micro-fluidic cooler may comprise at least one droplet generator for generating and impinging droplets of cooling fluid onto the integrated circuit. The at least one droplet generator may comprise at least one micro-electromechanical (MEMs) pump. The electronic device may also include at least one heat exchanger carried by the package and connected in fluid communication with the micro-fluidic cooler. The package may have a parallelepiped shape with a first pair of opposing major surfaces, a second pair of opposing side surfaces and a third pair of opposing end surfaces. In these embodiments, the at least one heat exchanger may preferably comprise a pair of heat exchangers coupled to the second pair of opposing side surfaces.

46 Claims, 4 Drawing Sheets

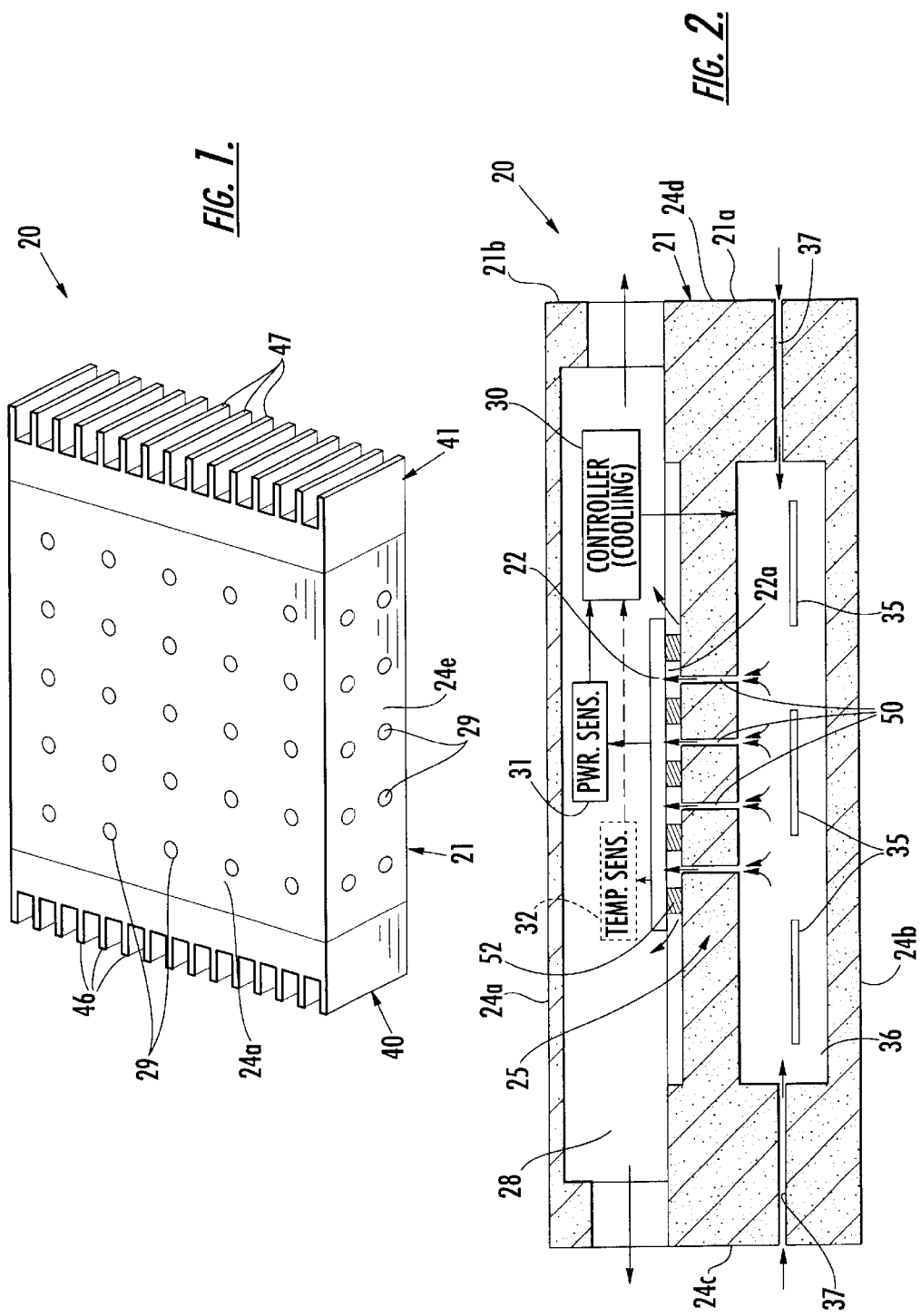

ELECTRONIC DEVICE USING EVAPORATIVE MICRO-COOLING AND ASSOCIATED METHODS

FIELD OF THE INVENTION

The present invention relates to the field of electronic devices, and, more particularly, to electronic devices including micro-fluidic cooling of one or more integrated circuits and associated methods.

BACKGROUND OF THE INVENTION

Integrated circuits are widely used in many types of electronic equipment. An integrated circuit may include a silicon or gallium arsenide substrate including a number of active devices, such as transistors, etc. formed in an upper surface of the substrate. It is also typically required to support one or more such integrated circuits in a package that provides protection and permits external electrical connection.

As the density of active devices on typical integrated circuits has increased, dissipation of the heat generated has become increasingly more important. In particular, a relatively large amount of heat may be generated in multi-chip modules (MCMs), microwave transmitters, and photonic devices, for example. U.S. Pat. No. 5,987,893 to Schulz-Harder et al. discloses a cooling package, such as for a laser device, including channels through which cooling water flows. Heat is removed using a series of Peltier elements in Advances in micro-electromechanical (MEMs) technology have allowed designers to develop further cooling techniques for integrated circuits based on circulating dielectric cooling fluids adjacent an integrated circuit to thereby remove waste heat. For example, U.S. Pat. No. 5,876,187 to Afromowitz et al. discloses micro-pumps with associated valves that may be used for a number of applications, such as environmental, biomedical, medical, biotechnical, printing, analytical instrumentation, and miniature cooling applications.

Heat may be removed from an integrated circuit by free convective cooling of gases or liquids. The liquids typically remove more heat. Forced convective cooling may provide additional efficiency as the gases or liquids are circulated in contact with the device to be cooled. Cooling using boiling liquid provides yet higher efficiency.

Unfortunately, an integrated circuit may operate at different power levels and thereby generate different amounts of waste heat. Accordingly, a typical MEMs micro-cooling system may not operate efficiently over all of the possible operating ranges of the integrated circuit.

SUMMARY OF THE INVENTION

In view of the foregoing background it is therefore an object of the invention to provide an electronic device and associated methods which provide highly efficient cooling for the one or more integrated circuits in the overall package.

This and other objects, features and advantages in accordance with one aspect of the present invention are provided by an electronic device comprising a package surrounding at least one integrated circuit, a micro-fluidic cooler in the package, and a controller for controlling the micro-fluidic cooler so that the cooling fluid provides evaporative cooling. The controller may also be provided in the package. Evaporative cooling provides very efficient cooling since it may be based upon droplet impingement and boiling of the cooling fluid. Such evaporative micro-cooling is considerably more efficient than free convective or forced convective cooling. The electronic device may be relatively compact and yet have a highly efficient cooling system for the removal of waste heat from the at least one integrated circuit.

The electronic device may comprise a power consumption sensor connected to the at least one integrated circuit, and the controller may control the micro-fluidic cooler responsive to the power consumption sensor. Alternately or additionally, a temperature sensor may be connected to the at least one integrated circuit, and the controller may control the micro-fluidic cooler responsive to the sensed temperature.

The micro-fluidic cooler may comprise at least one droplet generator for generating and impinging droplets of cooling fluid onto the integrated circuit. More particularly, the at least one droplet generator may comprise at least one micro-electromechanical (MEMs) pump.

The electronic device may also include at least one heat exchanger carried by the package and connected in fluid communication with the micro-fluidic cooler. In one particularly advantageous class of embodiments, the package may have a parallelepiped shape with a first pair of opposing major surfaces, a second pair of opposing side surfaces and a third pair of opposing end surfaces. In these embodiments, the at least one heat exchanger may preferably comprise a pair of heat exchangers, each coupled to a respective one of the second pair of opposing side surfaces. This configuration may facilitate stacking of a plurality of such units or modules. Each module may also comprise electrical connectors carried by at least one of the first pair of opposing major surfaces and the third pair of opposing end surfaces.

The package may comprise a base and a lid connected thereto defining a cavity receiving the at least one integrated circuit. The micro-fluidic cooler may comprise at least one micro-fluidic passageway extending through the base and directed toward the at least one integrated circuit. In addition, the at least one integrated circuit may comprise an active surface comprising active devices therein, and the at least one integrated circuit may be positioned so that the active surface is adjacent the at least one micro-fluidic passageway. In this arrangement, the droplets of the cooling fluid may be delivered directly onto the active surface of the integrated circuit to efficiently remove heat therefrom. Also, using such flip chip bonding, a plurality of bodies, such as solder balls, may connect the at least one integrated circuit to the base in spaced apart relation therefrom so that cooling fluid also flows adjacent the bodies and into the cavity. Heat is also removed from the solder balls, and cooling efficiency is further enhanced.

The package may comprise low temperature co-fired ceramic (LTCC) material. This material offers advantages in terms of ruggedness, and an ability to form recesses and passageways therein.

Another aspect of the invention relates to a method for cooling at least one integrated circuit in a package also including a micro-fluidic cooler therein. The micro-fluidic cooler may also include a cooling fluid. The method preferably comprises controlling the micro-fluidic cooler so that the cooling fluid provides evaporative cooling. The controlling may further comprise sensing power consumption of the at least one integrated circuit and controlling the micro-fluidic cooler responsive thereto. Controlling may alternately comprise sensing a temperature of the at least one integrated circuit and controlling the micro-fluidic cooler responsive thereto.

BRIEF DESCRIPTION OF THE DRAWINGS

FIG. 1 is a perspective view of the electronic device in accordance with the invention.

FIG. 2 is a schematic cross-sectional view of the electronic device as shown in FIG. 1 with the heat sinks removed for clarity.

DETAILED DESCRIPTION OF THE PREFERRED EMBODIMENTS

Figure 3:
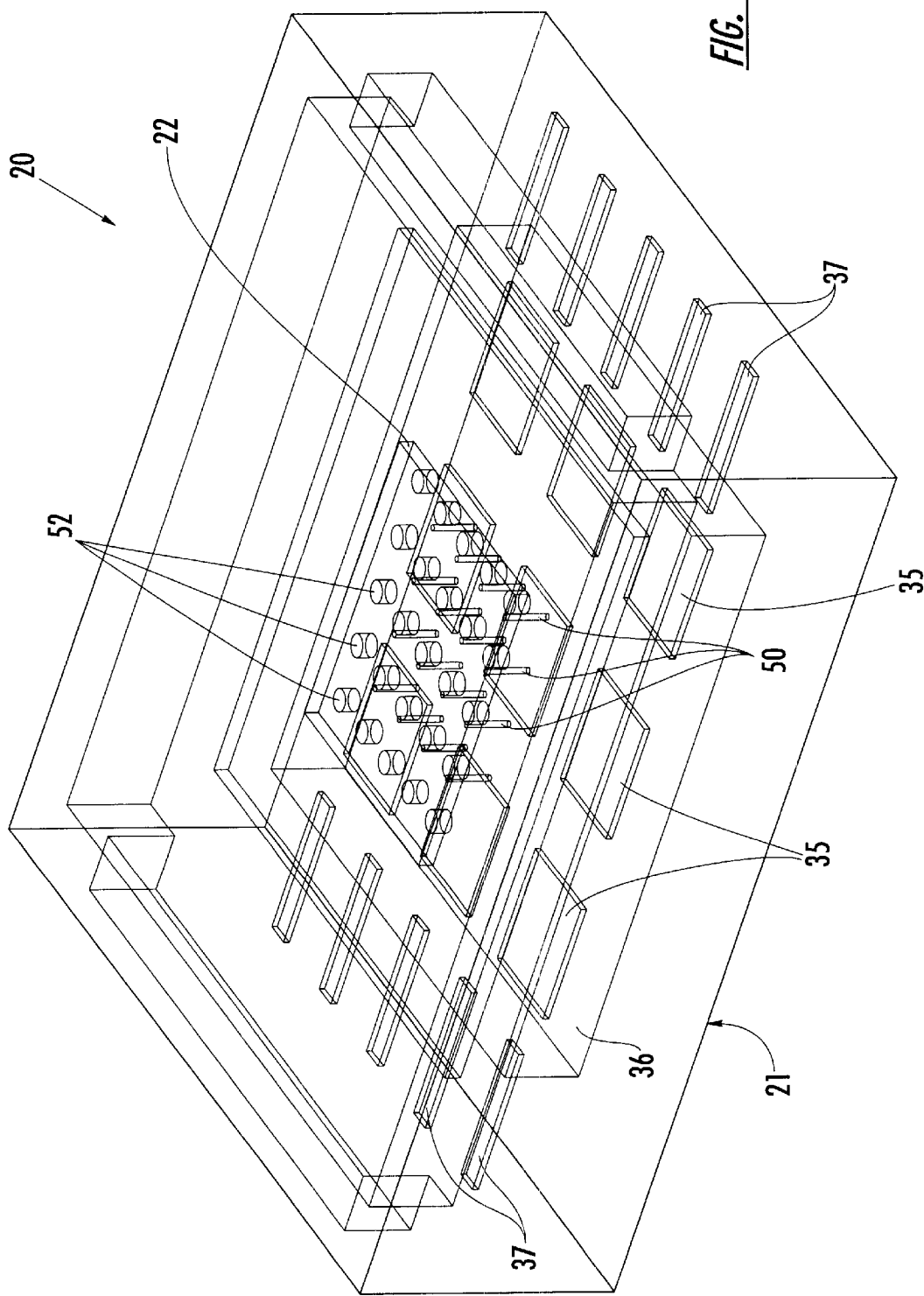
FIG. 3 is a transparent perspective view of the electronic device as shown in FIG. 1 with the heat sinks removed for clarity.
Figure 4:
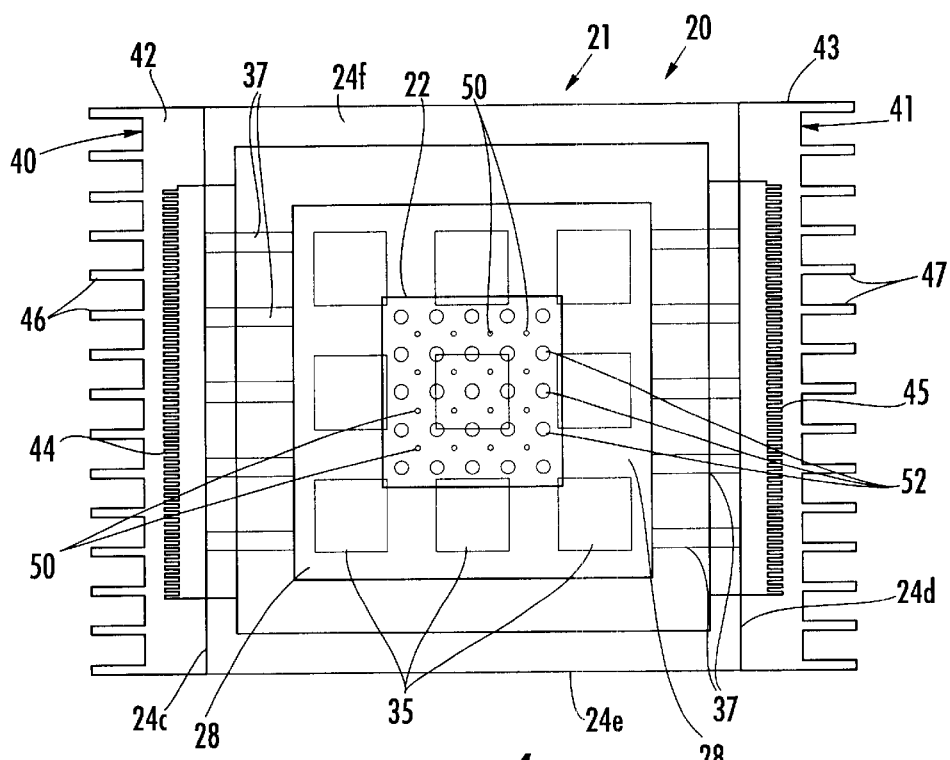
FIG. 4 is a transparent top plan view of the electronic device as shown in FIG. 1.

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout.

Referring initially to FIGS. 1–5, the electronic device 20 in accordance with the invention is now initially described. The electronic device 20 includes a package 21 surrounding an integrated circuit 22. The package 21 includes a base 21a and a lid 21b connected thereto. The package 21 may comprise low temperature co-fired ceramic (LTCC) material, for example. This material offers advantages in terms of ruggedness, and an ability to form recesses and small stable passageways therein, as well as to provide electrical paths therethrough. Of course, other similar materials may be used as well. Also, in other embodiments, two or more integrated circuits 22 may be carried by the package 21 as will be appreciated by those skilled in the art.

The electronic device also includes a micro-fluidic cooler 25 in the package 21, and a controller schematically illustrated by block 30 in FIG. 2 for controlling the micro-fluidic cooler so that the cooling fluid provides evaporative cooling as will be described in greater detail below. The evaporative cooling may be based upon droplet impingement to provide yet greater heat removal capacity as will be appreciated by those skilled in the art and as explained in greater detail below. The controller 30 may be provided by circuitry on the integrated circuit 22, or may be a separate circuit within the package 21. Alternately, the controller 30 may also be provided external to the package 30 in some other embodiments. In yet other embodiments, portions of the controller 30 may be provided both inside and outside the package 21.

The electronic device 20 may comprise a power consumption sensor schematically illustrated by block 31 in FIG. 2 that is connected to the integrated circuit 22 to sense its power consumption. Typically such a sensor would sense current flow through the one or more power supply leads to the integrated circuit 22. Accordingly, the controller 30 may control the micro-fluidic cooler 25 responsive to the power consumption sensor. Alternately, a temperature sensor schematically illustrated by the dashed block 32 in FIG. 2 may be connected to the integrated circuit 22, and the controller 30 may control the micro-fluidic cooler 25 responsive to the sensed temperature. Of course, in other embodiments, a combination of these sensors 31, 32 may be used.

The micro-fluidic cooler may comprise at least one droplet generator for generating and impinging droplets of cooling fluid onto the integrated circuit. More particularly, the at least one droplet generator comprises at least one microelectromechanical (MEMs) pump. In the illustrated embodiment, a series of MEMs pumps 35 are provided within a pump cavity 36 in the base 21. The MEMs pumps 35 are connected at their inlets to the micro-fluidic passageways or channels 37.

As will be appreciated by those skilled in the art, the term MEMs pump 35 is used herein to denote any MEMs type device which can cause the movement of cooling fluid. It will be recognized that a typical MEMs pump may include a MEMs actuator and one or more valves associated therewith to control fluid flow.

The electronic device 20 may also include at least one heat exchanger carried by the package 21 and connected in fluid communication with the micro-fluidic cooler 25. In one particularly advantageous class of embodiments and as shown in the illustrated electronic device 20, the package 21 may have a parallelepiped shape with a first pair of opposing major surfaces 24a, 24b (see FIG. 2) a second pair of opposing side surfaces 24c, 24d (see FIGS. 2 and 3) and a third pair of opposing end surfaces 24e, 24f (see FIG. 3).

In the illustrated embodiment of the electronic device 20, the at least one heat exchanger comprises a pair of heat exchangers 41, 42, each being coupled to a respective one of the second pair of opposing side surfaces 24c, 24d. As perhaps best shown in FIG. 4, each heat exchanger 40, 41, in turn, includes a respective body portion 42, 43. Each body portion 42, 43 includes microfluidic passageways 44, 45 therein. In addition, each body portion 42, 43 also carries a set of respective cooling fins 46, 47.

In other embodiments, the heat exchangers 40, 41 may include additional liquid passageways, not shown, for providing a liquid-to-liquid exchange of heat rather that the liquid-to-air exchange as shown in the illustrated embodiment.

The package 21, as best shown in FIG. 1, may carry electrical connectors 29 on at least one of the first pair of opposing major surfaces and the third pair of opposing end surfaces. As shown in the illustrated device 20, connectors 29 may be provided on both pairs of surfaces. In other embodiments, edge connectors may be provided to connect to a ribbon type cable, for example, as will be appreciated by those skilled in the art.

The base and lid 21a, 21b of the package 21 may be configured to define a cavity 28 receiving the integrated circuit 22. The micro-fluidic cooler 25 also illustratively includes a series of spaced apart micro-fluidic passageways 50 extending through the base 21a and directed toward the integrated circuit 22.

As will be appreciated by those skilled in the art, the integrated circuit 22 may comprise an active surface 22a with active devices therein. As shown in the illustrated embodiment, the integrated circuit 22 is mounted using flip chip technology so that the active surface 22a is adjacent the outlet ends of the micro-fluidic passageways 50. Accordingly, the droplets of the cooling fluid may be delivered directly onto the active surface 22a of the integrated circuit 22 to efficiently remove heat therefrom.

In accordance with flip chip bonding techniques, a plurality of bodies, such as solder balls 52, are used to mount and electrically connect the integrated circuit 22 to corresponding electrical traces, not shown, carried by the base 21a. The integrated circuit 22 is thereby positioned in spaced apart relation from the base 24b so that cooling fluid also flows adjacent the solder balls 52 and into the cavity 28 surrounding the integrated circuit 22. Accordingly, heat is also removed from the solder balls 52, and cooling from the active surface 22a of the integrated circuit 22 is further enhanced. Heat may also be removed from the back surface of the integrated circuit 22 as cooling fluid flows through the cavity 28.

As will be appreciated by those skilled in the art, in other embodiments, the integrated circuit 22 may be attached with its bottom surface connected to the base 24b. Accordingly, the cooling fluid may be directed to the bottom surface to still provide efficient cooling, or the cooling fluid can be directed to the exposed active surface using a shower type arrangement.

Figure 5:
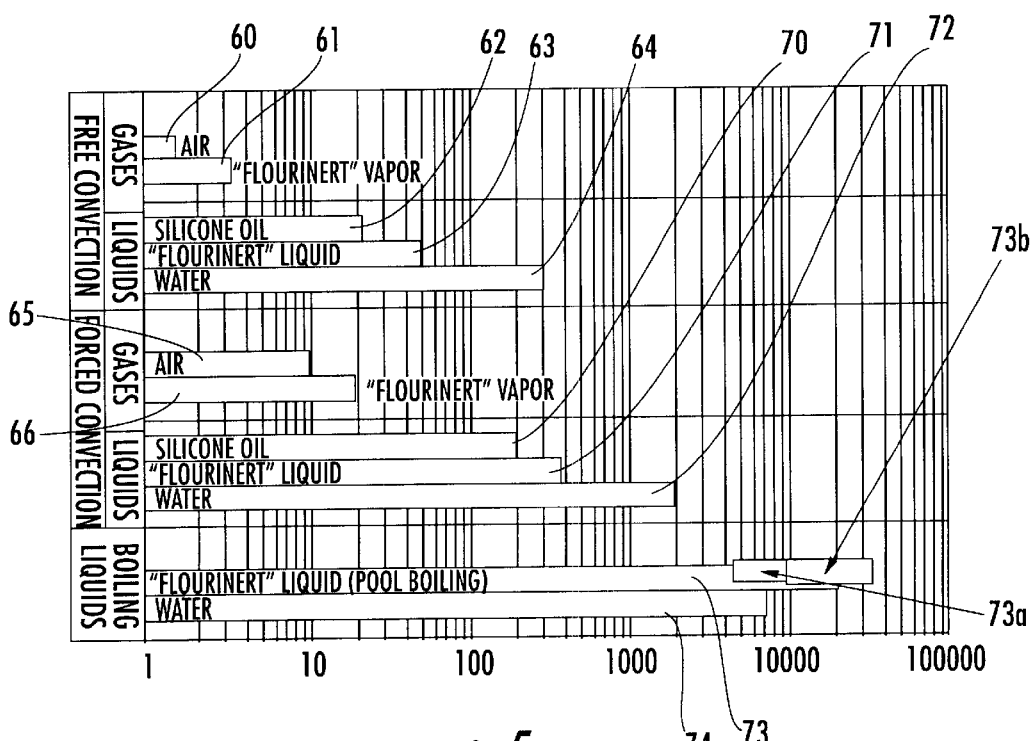
FIG. 5 is a graph illustrating comparisons of the evaporative cooling efficiency of the present invention versus various convective cooling approaches.

Turning now more particularly to the graphs of FIG. 5, the advantages of using a controller 30 to control the micro-cooler 25 to provide evaporative cooling is now described in further detail. The top two plots 60, 61 provide values of heat transfer coefficients in Btu/Hr Ft$^2$ F for free convective cooling using air and FLUORINERT vapor, respectively. The next three plots from the top 62, 63 and 64 provide similar values for silicone oil, FLUORINERT liquid and water, respectively, for free convective cooling. FLUORINERT materials are heat transfer materials available from 3M as will be appreciated by those skilled in the art.

Forced convective cooling using air and FLUORINERT vapor are given by plots 65 and 66. Forced convective cooling values using silicone oil, FLUORINERT liquid, and water are given by plots 70, 71 and 72. As can be seen forced convective cooling provides greater heat transfer than free convective cooling, and liquids are generally superior to gases.

Plots 73 and 74 are for FLUORINERT liquid and water, respectively, operating at their boiling points. The plot portion indicated by reference numeral 73a, is for flow boiling along with subcooling, and the plot portion 73b is for droplet impingement evaporative cooling. As will be readily appreciated, evaporative cooling provides very efficient cooling, especially when the micro-cooler is operated at the regime using droplet impingement evaporative cooling.

Figure 6:
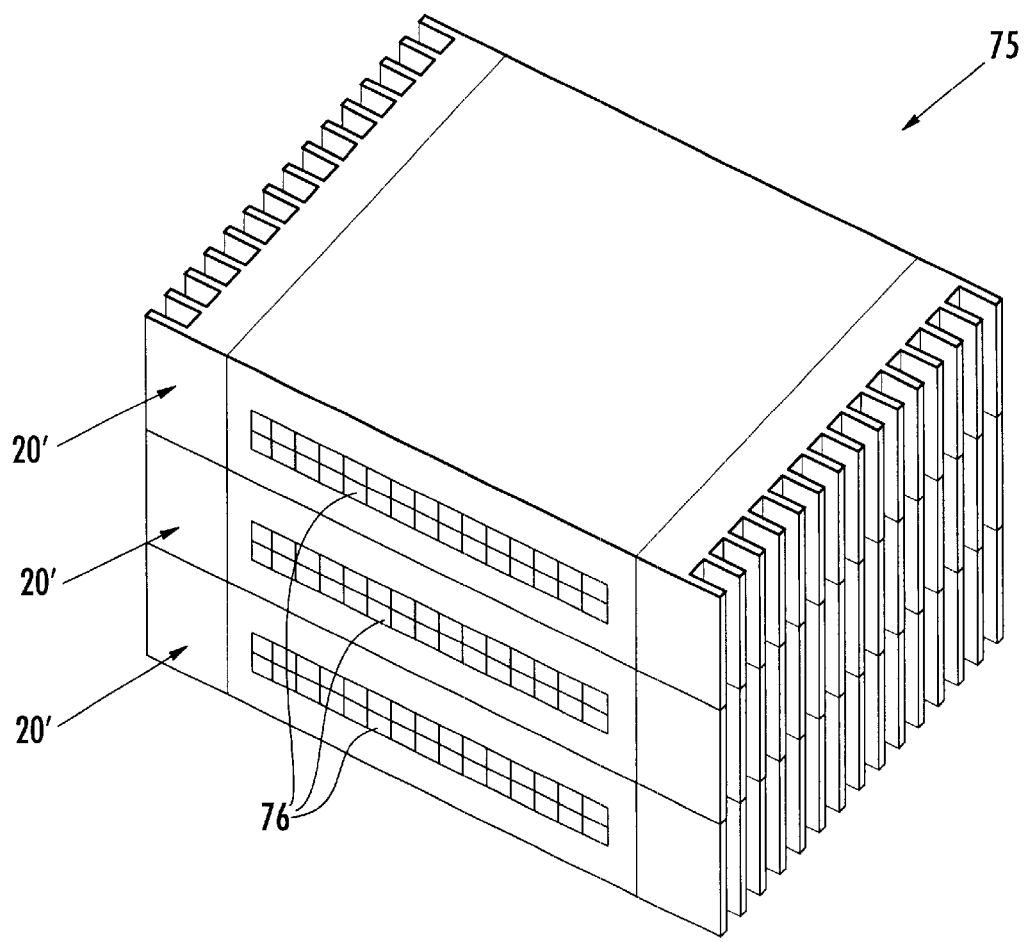
FIG. 6 is a perspective view of a plurality of the electronic devices as shown in FIG. 1 assembled in stacked relation.

Turning now additionally to FIG. 6, an assembly of stacked devices 20' is now described. Because of the parallelepiped shape of each electronic module or device 20', a series of such devices may be stacked on top of each other. In addition, in the illustrated embodiment, each of the electronic devices 20' may include an edge connector 76.

Many modifications and other embodiments of the invention will come to the mind of one skilled in the art having the benefit of the teachings presented in the foregoing descriptions and the associated drawings. Accordingly, it is understood that the invention is not to be limited to the embodiments disclosed, and that other modifications and embodiments are intended to be included within the spirit and scope of the appended claims.

That which is claimed is:

1. An electronic device comprising:
   at least one integrated circuit;
   a package surrounding said at least one integrated circuit;
   a micro-fluidic cooler in said package and thermally coupled to said at least one integrated circuit to remove heat therefrom, said micro-fluidic cooler comprising a cooling fluid; and
   a controller for controlling said micro-fluidic cooler so that the cooling fluid provides evaporative cooling.

2. An electronic device according to claim 1 wherein said controller is contained within said package.

3. An electronic device according to claim 1 further comprising a power consumption sensor connected to said at least one integrated circuit; and wherein said controller controls said micro-fluidic cooler responsive to said power consumption sensor.

4. An electronic device according to claim 1 further comprising a temperature sensor connected to said at least one integrated circuit; and wherein said controller controls said micro-fluidic cooler responsive to said temperature sensor.

5. An electronic device according to claim 1 wherein said micro-fluidic cooler comprises at least one droplet generator for generating and impinging droplets of cooling fluid onto said integrated circuit.

6. An electronic device according to claim 5 wherein said at least one droplet generator comprises at least one micro-electromechanical (MEMs) pump.

7. An electronic device according to claim 1 further comprising at least one heat exchanger carried by said package and connected in fluid communication with said micro-fluidic cooler.

8. An electronic device according to claim 7 wherein said package has a parallelepiped shape with a first pair of opposing major surfaces, a second pair of opposing side surfaces and a third pair of opposing end surfaces; and wherein said at least one heat exchanger comprises a pair of heat exchangers coupled to said second pair of opposing side surfaces.

9. An electronic device according to claim 7 further comprising electrical connectors carried by at least one of said first pair of opposing major surfaces and said third pair of opposing end surfaces.

10. An electronic device according to claim 1 wherein said package comprises a base and a lid connected thereto defining a cavity receiving said at least one integrated circuit.

11. An electronic device according to claim 10 wherein said micro-fluidic cooler comprises at least one micro-fluidic passageway extending through said base and directed toward said at least one integrated circuit.

12. An electronic device according to claim 10 wherein said at least one integrated circuit comprises an active surface comprising active devices therein; and wherein at least one integrated circuit is positioned so that the active surface is adjacent said at least one micro-fluidic passageway.

13. An electronic device according to claim 10 further comprising a plurality of bodies connecting said at least one integrated circuit to said base in spaced apart relation therefrom so that cooling fluid flows adjacent said bodies and into the cavity.

14. An electronic device according to claim 1 wherein said package comprises low temperature co-fired ceramic (LTCC) material.

15. An electronic device comprising:
   at least one integrated circuit;
   a package surrounding said at least one integrated circuit;
   a micro-fluidic cooler in said package and thermally coupled to said at least one integrated circuit to remove heat therefrom, said micro-fluidic cooler comprising a cooling fluid and at least one micro-electromechanical (MEMs) pump for generating cooling fluid droplets;
   a sensor for sensing a condition of said at least one integrated circuit; and
   a controller carried by said package for controlling said at least one MEMs pump based upon said sensor so that the cooling fluid provides droplet impingement evaporative cooling.

16. An electronic device according to claim 15 wherein said sensor comprises a power consumption sensor connected to said at least one integrated circuit.

17. An electronic device according to claim 15 wherein said sensor comprises a temperature sensor connected to said at least one integrated circuit.

18. An electronic device according to claim 15 further comprising at least one heat exchanger carried by said package and connected in fluid communication with said micro-fluidic cooler.

19. An electronic device according to claim 18 wherein said package has a parallelepiped shape with a first pair of opposing major surfaces, a second pair of opposing side surfaces and a third pair of opposing end surfaces; and wherein said at least one heat exchanger comprises a pair of heat exchangers coupled to said second pair of opposing side surfaces.

20. An electronic device according to claim 18 further comprising electrical connectors carried by at least one of said first pair of opposing major surfaces and said third pair of opposing end surfaces.

21. An electronic device according to claim 15 wherein said package comprises a base and a lid connected thereto defining a cavity receiving said at least one integrated circuit.

22. An electronic device according to claim 15 wherein said package comprises low temperature co-fired ceramic (LTCC) material.

23. An electronic device comprising:
   at least one integrated circuit;
   a package surrounding said at least one integrated circuit, said package having a parallelepiped shape with a first pair of opposing major surfaces, a second pair of opposing side surfaces and a third pair of opposing end surfaces;
   a micro-fluidic cooler in said package and thermally coupled to said at least one integrated circuit to remove heat therefrom, said micro-fluidic cooler comprising a cooling fluid; and
   a pair of heat exchangers connected to said second pair of opposing side surfaces and connected in fluid communication with said micro-fluidic cooler.

24. An electronic device according to claim 23 further comprising electrical connectors carried by at least one of said first pair of opposing major surfaces and said third pair of opposing end surfaces.

25. An electronic device according to claim 23 wherein said micro-fluidic cooler comprises at least one droplet generator for generating and impinging droplets of cooling fluid onto said integrated circuit.

26. An electronic device according to claim 23 wherein said at least one droplet generator comprises at least one micro-electromechanical (MEMs) pump.

27. An electronic device according to claim 23 wherein said package comprises a base and a lid connected thereto defining a cavity receiving said at least one integrated circuit.

28. An electronic device according to claim 23 wherein said package comprises low temperature co-fired ceramic (LTCC) material.

29. An electronic device comprising:
   a plurality of electronic modules arranged in stacked relation, each electronic module comprising:
   at least one integrated circuit,
   a package surrounding said at least one integrated circuit, said package having a parallelepiped shape with a first pair of opposing major surfaces, a second pair of opposing side surfaces and a third pair of opposing end surfaces,
   a micro-fluidic cooler in said package and thermally coupled to said at least one integrated circuit to remove heat therefrom, said micro-fluidic cooler comprising a cooling fluid, and
   a pair of heat exchangers connected to said second pair of opposing side surfaces and connected in fluid communication with said micro-fluidic cooler.

30. An electronic device according to claim 29 further comprising electrical connectors carried by at least one of said first pair of opposing major surfaces and said third pair of opposing end surfaces.

31. An electronic device according to claim 29 wherein said micro-fluidic cooler comprises at least one droplet generator for generating and impinging droplets of cooling fluid onto said integrated circuit.

32. An electronic device according to claim 29 wherein said at least one droplet generator comprises at least one micro-electromechanical (MEMs) pump.

33. An electronic device according to claim 29 wherein said package comprises a base and a lid connected thereto defining a cavity receiving said at least one integrated circuit.

34. An electronic device according to claim 29 wherein said package comprises low temperature co-fired ceramic (LTCC) material.

35. An electronic device comprising:
   at least one integrated circuit;
   a package comprising a base and a lid connected thereto defining a cavity receiving said at least one integrated circuit;
   a micro-fluidic cooler in said package comprising a cooling fluid and at least one micro-fluidic passageway extending through said base and directed toward said at least one integrated circuit; and
   a plurality of bodies connecting said at least one integrated circuit to said base in spaced apart relation therefrom so that cooling fluid flows adjacent said bodies and into the cavity.

36. An electronic device according to claim 35 wherein said at least one integrated circuit comprises an active surface comprising active devices therein; and wherein at least one integrated circuit is positioned so that the active surface is adjacent said at least one micro-fluidic passageway.

37. An electronic device according to claim 35 further comprising at least one heat exchanger carried by said package and connected in fluid communication with said micro-fluidic cooler.

38. An electronic device according to claim 37 wherein said package has a parallelepiped shape with a first pair of opposing major surfaces, a second pair of opposing side surfaces and a third pair of opposing end surfaces; and wherein said at least one heat exchanger comprises a pair of heat exchangers coupled to said second pair of opposing side surfaces.

39. An electronic device according to claim 38 further comprising electrical connectors carried by at least one of said first pair of opposing major surfaces and said third pair of opposing end surfaces.

40. An electronic device according to claim 35 wherein said package comprises low temperature co-fired ceramic (LTCC) material.

41. A method for cooling at least one integrated circuit comprising:
- positioning the at least one integrated circuit within a package so that the package surrounds the at least one integrated circuit;
- positioning a micro-fluidic cooler in the package and thermally coupling the micro-fluidic cooler to the at least one integrated circuit to remove heat therefrom, the micro-fluidic cooler comprising a cooling fluid; and
- controlling the micro-fluidic cooler so that the cooling fluid provides evaporative cooling of the at least one integrated circuit.

42. A method according to claim 41 wherein controlling further comprises sensing power consumption of the at least one integrated circuit and controlling the micro-fluidic cooler responsive thereto.

43. A method according to claim 41 wherein controlling further comprises sensing a temperature of the at least one integrated circuit and controlling and micro-fluidic cooler responsive thereto.

44. A method according to claim 41 wherein the micro-fluidic cooler comprises at least one micro-electromechanical (MEMs) pump; and wherein controlling the micro-fluidic cooler comprises controlling the at least one MEMs pump.

45. A method according to claim 41 further comprising connecting at least one heat exchanger carried by the package in fluid communication with the micro-fluidic cooler.

46. A method according to claim 45 wherein the package has a parallelepiped shape with a first pair of opposing major surfaces, a second pair of opposing side surfaces and a third pair of opposing end surfaces; and wherein the at least one heat exchanger comprises a pair of heat exchangers connected to the second pair of opposing side surfaces.

* * * * *

UNITED STATES PATENT AND TRADEMARK OFFICE
CERTIFICATE OF CORRECTION

PATENT NO. : 6,459,581 B1 Page 1 of 1
DATED : October 1, 2002
INVENTOR(S) : Charles M. Newton, Randy T. Pike and Richard A. Gassman It is certified that error appears in the above-identified patent and that said Letters Patent is hereby corrected as shown below:

Column 1,
Line 30, delete "elements in" insert -- elements in the package. --

Signed and Sealed this

Fourth Day of February, 2003

JAMES E. ROGAN
*Director of the United States Patent and Trademark Office*